United States Patent
Nagano et al.

(10) Patent No.: US 9,768,222 B2
(45) Date of Patent: *Sep. 19, 2017

(54) LIGHT DETECTION DEVICE INCLUDING A SEMICONDUCTOR LIGHT DETECTION ELEMENT, A MOUNTING SUBSTRATE, AND QUENCHING CIRCUITS WHEREIN THE FIRST ELECTRODES OF THE LIGHT DETECTION ELEMENT CORRESPONDING TO THE SECOND ELECTRODES OF THE MOUNTING SUBSTRATE ARE ELECTRICALLY CONNECTED THROUGH BUMP ELECTRODES

(71) Applicant: HAMAMATSU PHOTONICS K.K., Hamamatsu-shi, Shizuoka (JP)

(72) Inventors: Terumasa Nagano, Hamamatsu (JP); Noburo Hosokawa, Hamamatsu (JP); Tomofumi Suzuki, Hamamatsu (JP); Takashi Baba, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/150,859

(22) Filed: May 10, 2016

(65) Prior Publication Data
US 2016/0254307 A1 Sep. 1, 2016

Related U.S. Application Data

(63) Continuation of application No. 14/350,647, filed as application No. PCT/JP2012/069727 on Aug. 2, 2012, now Pat. No. 9,368,528.

(30) Foreign Application Priority Data

Oct. 21, 2011 (JP) .................................. 2011-232109

(51) Int. Cl.
| H01L 27/146 | (2006.01) |
| H01L 31/107 | (2006.01) |
| H01L 27/144 | (2006.01) |

(52) U.S. Cl.
CPC .... H01L 27/14643 (2013.01); H01L 27/1446 (2013.01); H01L 27/14618 (2013.01);
(Continued)

(58) Field of Classification Search
CPC H01L 31/107; H01L 27/146; H01L 31/02027
(Continued)

(56) References Cited

U.S. PATENT DOCUMENTS

| 8,860,166 B2 | 10/2014 | Sanfilippo et al. |
| 8,969,990 B2 * | 3/2015 | Nagano ............... H01L 27/1446 257/438 |

(Continued)

FOREIGN PATENT DOCUMENTS

| CN | 101163988 | 4/2008 |
| CN | 102024863 | 4/2011 |

(Continued)

OTHER PUBLICATIONS

U.S. Office Action dated Sep. 17, 2015 that issued in U.S. Appl. No. 14/352,429 including Double Patenting Rejections on pp. 2-5.
(Continued)

*Primary Examiner* — Que T Le
(74) *Attorney, Agent, or Firm* — Drinker Biddle & Reath LLP

(57) ABSTRACT

A light detection device 1 has a semiconductor light detection element having a semiconductor substrate, and a mounting substrate arranged as opposed to the semiconductor light detection element. The semiconductor light detection element includes a plurality of avalanche photodiodes operating in Geiger mode and formed in the semiconductor
(Continued)

substrate, and electrodes electrically connected to the respective avalanche photodiodes and arranged on a second principal surface side of the semiconductor substrate. The mounting substrate includes a plurality of electrodes arranged corresponding to the respective electrodes on a third principal surface side, and quenching resistors electrically connected to the respective electrodes and arranged on the third principal surface side. The electrodes and the electrodes are connected through bump electrodes.

5 Claims, 10 Drawing Sheets

(52) U.S. Cl.
CPC .. *H01L 27/14636* (2013.01); *H01L 27/14658* (2013.01); *H01L 31/107* (2013.01)

(58) Field of Classification Search
USPC .................................. 250/208.1, 214 R, 239
See application file for complete search history.

(56) References Cited

U.S. PATENT DOCUMENTS

| | | | | |
|---|---|---|---|---|
| 9,184,190 | B2* | 11/2015 | Sato | H01L 27/1446 |
| 9,368,528 | B2* | 6/2016 | Nagano | H01L 31/107 |
| 9,425,224 | B2* | 8/2016 | Nagano | H01L 27/1446 |
| 9,435,686 | B2* | 9/2016 | Nagano | H01L 27/144 |
| 2009/0008566 | A1 | 1/2009 | Agarwal et al. | |
| 2009/0256223 | A1 | 10/2009 | Yamamura et al. | |
| 2010/0148039 | A1 | 6/2010 | Gratz et al. | |
| 2011/0095388 | A1 | 4/2011 | Richter et al. | |

FOREIGN PATENT DOCUMENTS

| | | |
|---|---|---|
| JP | 2001-318155 A | 11/2001 |
| JP | 2004-165602 A | 6/2004 |
| JP | 2008-538606 | 10/2008 |
| JP | 2008-542706 | 11/2008 |
| JP | 2011-003739 A | 1/2011 |
| TW | 200950109 | 12/2009 |
| TW | 201117406 | 5/2011 |
| WO | WO 2004/019411 A1 | 3/2004 |
| WO | WO 2008/004547 A1 | 1/2008 |
| WO | WO 2010/057835 | 5/2010 |
| WO | WO 2011/087068 | 7/2011 |

OTHER PUBLICATIONS

English-language translation of International Preliminary Report on Patentability (IPRP) dated May 1, 2014 that issued in WO Patent Application No. PCT/JP2012/069727.
U.S. Office Action dated Apr. 5, 2017 that issued in U.S. Appl. No. 15/002,706 including Double Patenting Rejections on pp. 2-6.
U.S. Office Action dated Apr. 12, 2017 that issued in U.S. Appl. No. 15/213,629 including Double Patenting Rejections on pp. 2-5.

* cited by examiner

US 9,768,222 B2

LIGHT DETECTION DEVICE INCLUDING A SEMICONDUCTOR LIGHT DETECTION ELEMENT, A MOUNTING SUBSTRATE, AND QUENCHING CIRCUITS WHEREIN THE FIRST ELECTRODES OF THE LIGHT DETECTION ELEMENT CORRESPONDING TO THE SECOND ELECTRODES OF THE MOUNTING SUBSTRATE ARE ELECTRICALLY CONNECTED THROUGH BUMP ELECTRODES

This is a continuation application of copending application Ser. No. 14/350,647, having a §371 date of Apr. 9, 2014, which is a national stage filing based on PCT International Application No. PCT/JP2012/069727, filed on Aug. 2, 2012. The copending application Ser. No. 14/350,647 is incorporated by reference herein in its entirety.

TECHNICAL FIELD

The present invention relates to a light detection device.

BACKGROUND ART

There is a known front-illuminated photodiode array (semiconductor light detection element) having a plurality of avalanche photodiodes operating in Geiger mode, and quenching resistors connected in series to the respective avalanche photodiodes (e.g., cf. Patent Literature 1). In this photodiode array, the quenching resistors are provided on a semiconductor substrate in which the avalanche photodiodes constituting respective pixels are formed.

CITATION LIST

Patent Literature

Patent Literature 1: Japanese Patent Application Laid-Open Publication No. 2011-003739

SUMMARY OF INVENTION

Technical Problem

In the front-illuminated semiconductor light detection element described in Patent Literature 1, the quenching resistors are arranged on the light incident surface (front surface) side of the semiconductor substrate. For this reason, the fill factor is inevitably decreased by space where the quenching resistors are arranged, and thus there was a limit to increase in the fill factor.

Incidentally, the quenching resistors are arranged on a surface (back surface) side opposed to the light incident surface of the semiconductor substrate in a back-illuminated semiconductor light detection element. In the case of the back-illuminated semiconductor light detection element, the size of each pixel can also become smaller because of factors such as increase in the number of pixels. In this case, the quenching resistors sometimes have to be arranged outside regions of the respective pixels (active regions) because of restrictions from process design. A multiplication region formed during Geiger-mode operation of each avalanche photodiode is located in the active region. As a consequence, the fill factor has to be decreased by the area of the regions where the quenching resistors are arranged outside the active regions.

It is an object of the present invention to provide a light detection device capable of achieving remarkable improvement in the fill factor.

Solution to Problem

The present invention provides a light detection device comprising: a semiconductor light detection element having a semiconductor substrate including first and second principal surfaces opposed to each other; and a mounting substrate arranged as opposed to the semiconductor light detection element and having a third principal surface opposed to the second principal surface of the semiconductor substrate, wherein the semiconductor light detection element includes a plurality of avalanche photodiodes operating in Geiger mode and formed in the semiconductor substrate, and first electrodes electrically connected to the respective avalanche photodiodes and arranged on the second principal surface side of the semiconductor substrate, wherein the mounting substrate includes a plurality of second electrodes arranged corresponding to the respective first electrodes on the third principal surface side, and quenching circuits electrically connected to the respective second electrodes and arranged on the third principal surface side, and wherein the first electrodes and the second electrodes corresponding to the first electrodes are connected through bump electrodes.

In the present invention, the quenching circuits are arranged not on the semiconductor substrate of the semiconductor light detection element, but on the mounting substrate. Because of this configuration, each avalanche photodiode is formed in the semiconductor substrate, without consideration to the space for arrangement of the quenching circuits. As a consequence of this, remarkable improvement is achieved in the fill factor of the light detection device (semiconductor light detection element).

In the present invention, each avalanche photodiode may have: the semiconductor substrate of a first conductivity type; a first semiconductor region of a second conductivity type formed on the first principal surface side of the semiconductor substrate; a second semiconductor region of the second conductivity type formed in the first semiconductor region and having a higher impurity concentration than the first semiconductor region; and a third electrode arranged on the first principal surface side of the semiconductor substrate and electrically connected to the second semiconductor region, and in the semiconductor substrate, a through-hole electrode penetrating from the first principal surface side to the second principal surface side and electrically connecting the corresponding third electrode and first electrode may be formed for each avalanche photodiode. In this case, the fill factor is remarkably improved even in the case where the semiconductor light detection element used is a front-illuminated one. In addition, since the third electrode and first electrode are electrically connected through the through-hole electrode, an interconnection distance from the second semiconductor region to the quenching circuit through the third electrode, through-hole electrode, first electrode, bump electrode, and second electrode is relatively short, Therefore, influence of resistances and capacitances of interconnections is suppressed, so as to improve the temporal resolution.

In the present invention, each avalanche photodiode may have: the semiconductor substrate of a first conductivity type; a first semiconductor region of a second conductivity type formed on the second principal surface side of the semiconductor substrate; and a second semiconductor region of the first conductivity type forming a PN junction with the first semiconductor region and having a higher impurity concentration than the semiconductor substrate, and the first semiconductor region and the first electrode may be electrically connected. In this case, the fill factor is remarkably improved even in the case where the semiconductor light detection element used is a back-illuminated one. In addition, since the first electrode and second electrode are electrically connected through the bump electrode, the interconnection distance from the first semiconductor region to the quenching circuit is relatively short. Therefore, the influence of resistances and capacitances of interconnections is suppressed, so as to further improve the temporal resolution.

In the present invention, the mounting substrate may further include a common electrode to which the quenching circuits are connected in parallel. In this case, the avalanche photodiodes (quenching circuits) can be connected in parallel, without increase in the interconnection distance.

In the present invention, the quenching circuits may be passive quenching circuits or active quenching circuits.

Advantageous Effect of Invention

The present invention provides the light detection device capable of achieving remarkable improvement in the fill factor.

DESCRIPTION OF EMBODIMENTS

The preferred embodiments of the present invention will be described below in detail with reference to the accompanying drawings. In the description the same elements or elements with the same functionality will be denoted by the same reference signs, without redundant description.

Figure 1:
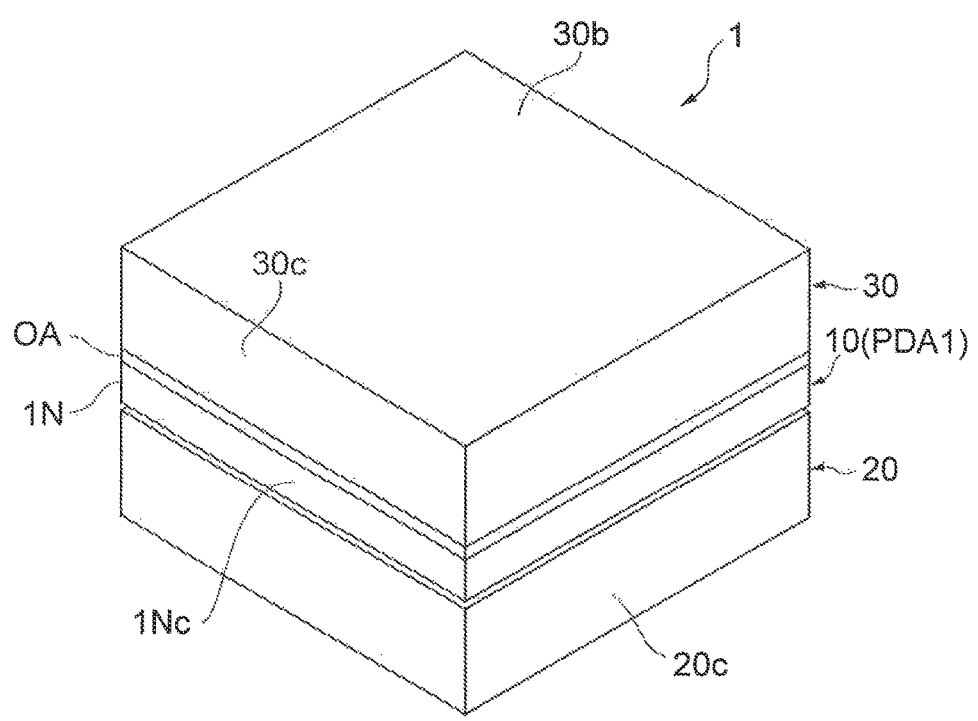
FIG. 1 is a schematic perspective view showing a light detection device according to an embodiment of the present invention.
Figure 2:
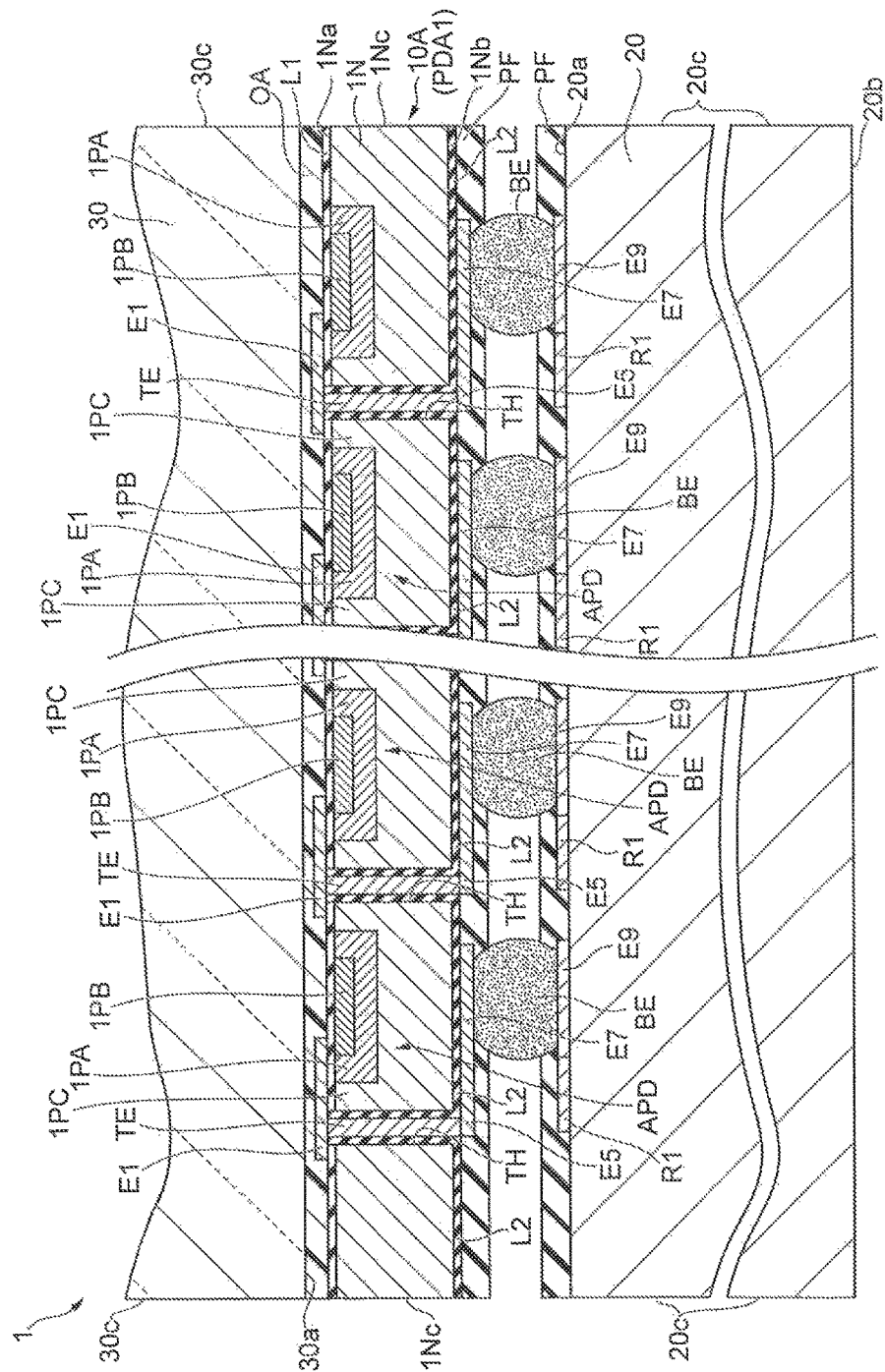
FIG. 2 is a drawing for explaining a sectional configuration of the light detection device according to the present embodiment.
Figure 3:
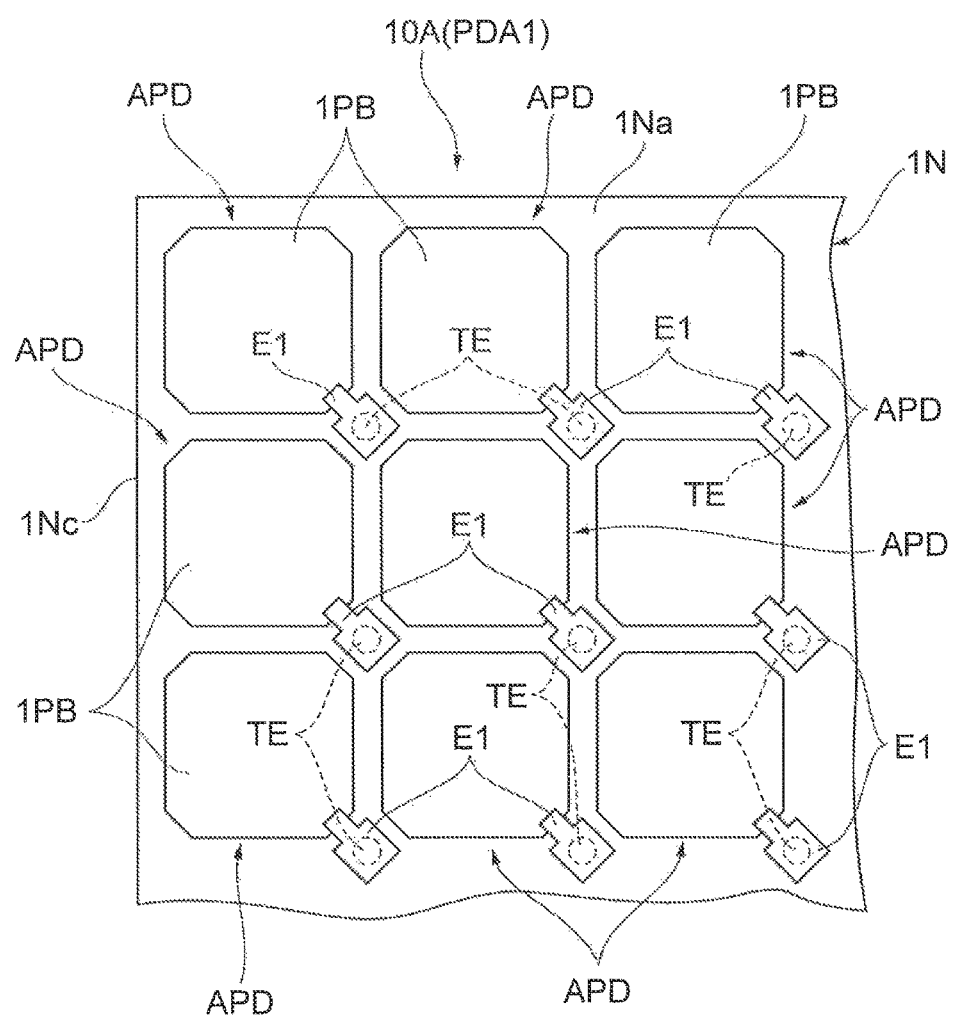
FIG. 3 is a schematic plan view of a semiconductor light detection element.
Figure 4:
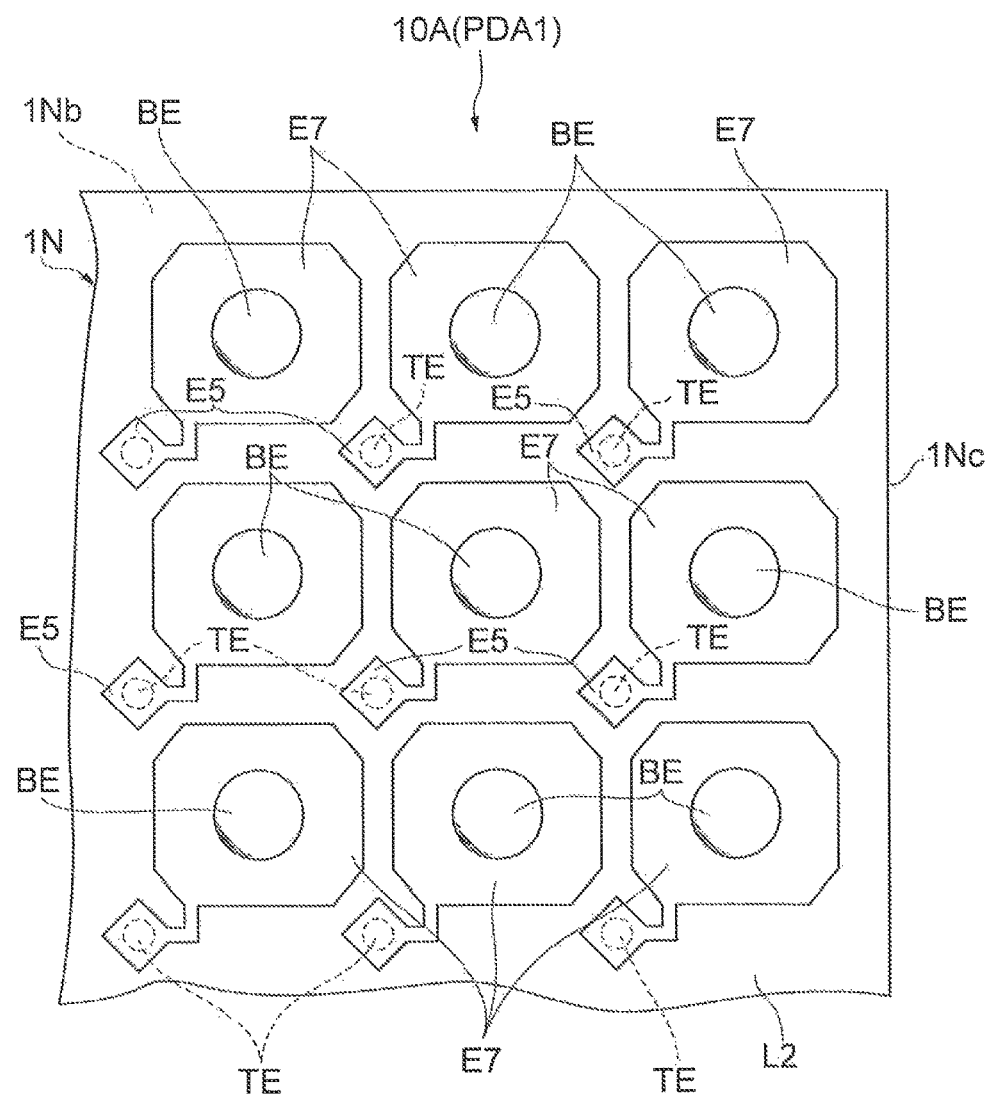
FIG. 4 is a schematic plan view of the semiconductor light detection element.
Figure 5:
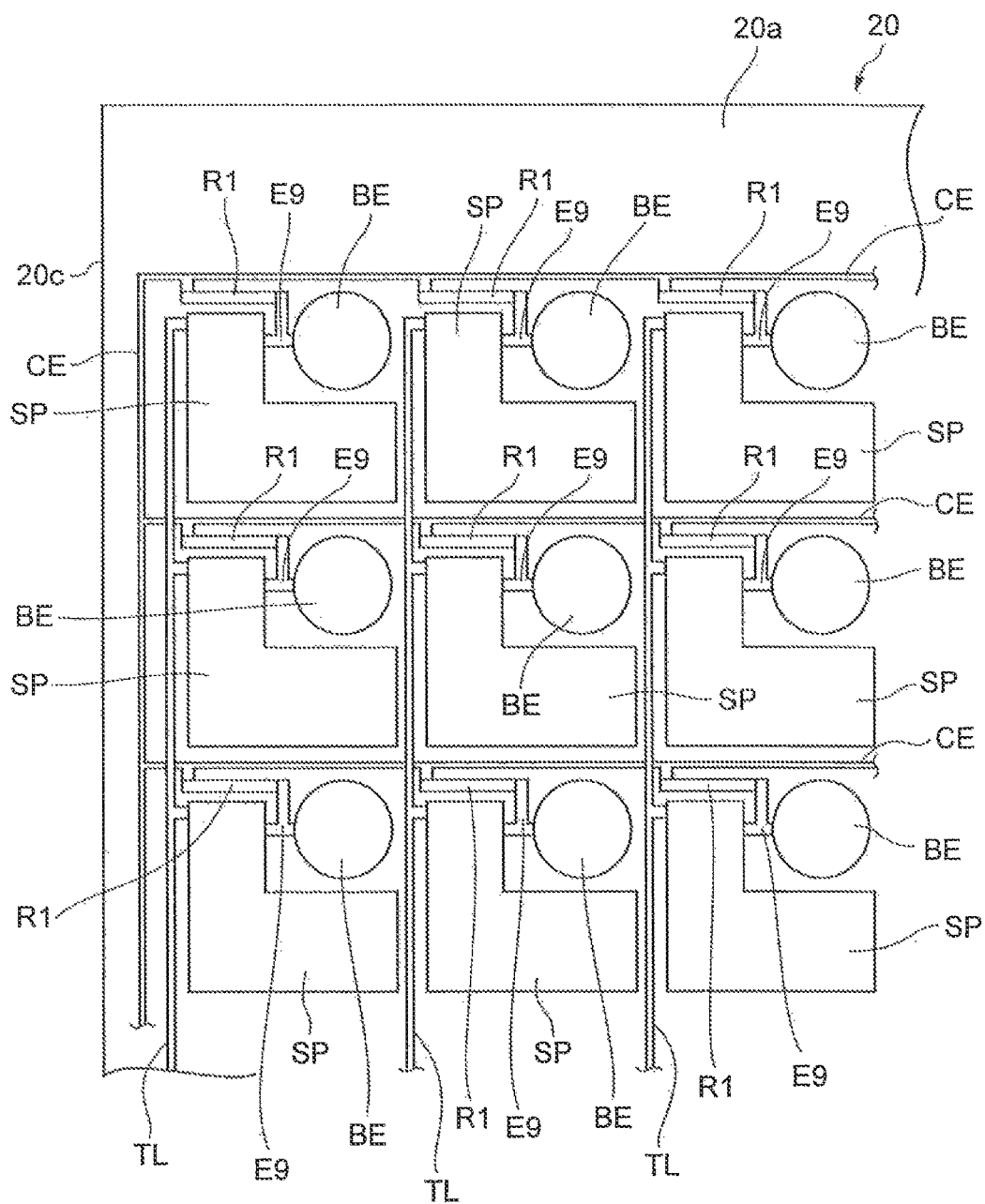
FIG. 5 is a schematic plan view of a mounting substrate.
Figure 6:
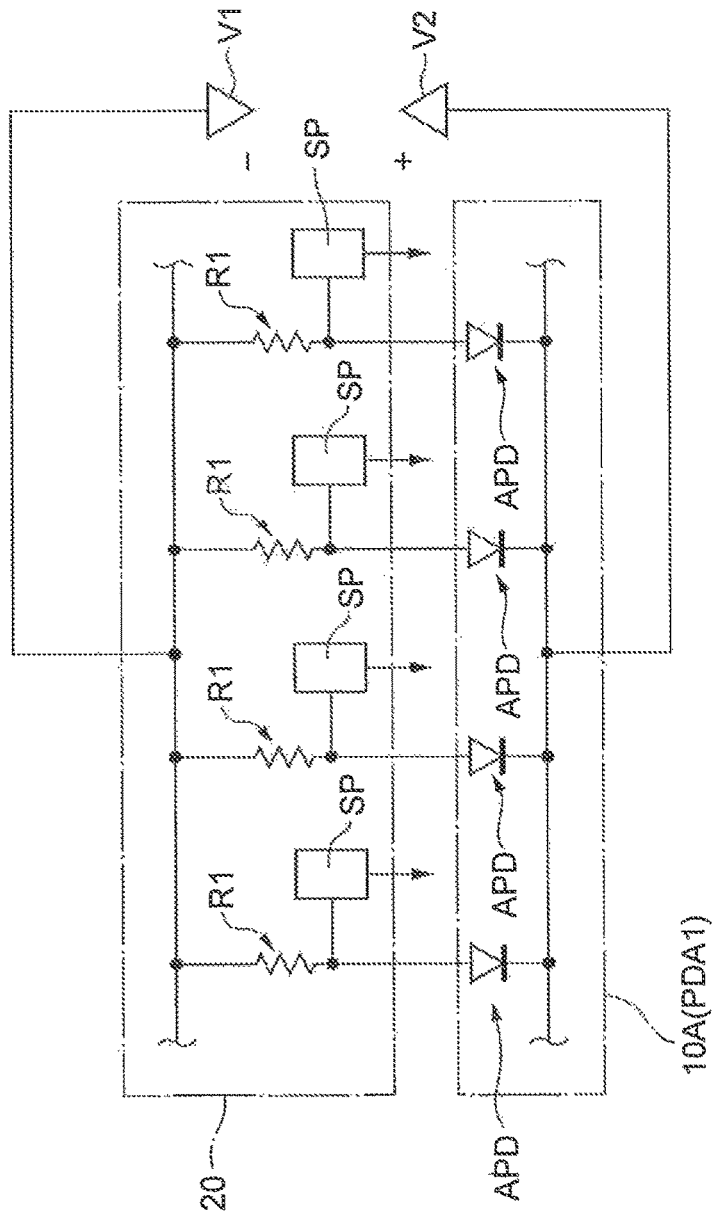
FIG. 6 is a circuit diagram of the light detection device.

A configuration of the light detection device 1 according to the present embodiment will be described with reference to FIGS. 1 to 6. FIG. 1 is a schematic perspective view showing the light detection device according to the present embodiment. FIG. 2 is a drawing for explaining a sectional configuration of the light detection device according to the present embodiment. FIGS. 3 and 4 are schematic plan views of a semiconductor light detection element. FIG. 5 is a schematic plan view of a mounting substrate. FIG. 6 is a circuit diagram of the light detection device.

The light detection device 1, as shown in FIGS. 1 and 2, has a semiconductor light detection element 10A, a mounting substrate 20, and a glass substrate 30. The mounting substrate 20 is arranged as opposed to the semiconductor light detection element 10A. The glass substrate 30 is arranged as opposed to the semiconductor light detection element 10A. The semiconductor light detection element 10A is arranged between the mounting substrate 20 and the glass substrate 30.

The semiconductor light detection element 10A consists of a front-illuminated photodiode array PDA1. The photodiode array PDA1 has a semiconductor substrate 1N of a rectangular shape on the plan view. The semiconductor substrate 1N includes a principal surface 1Na and a principal surface 1Nb opposed to each other. The semiconductor substrate 1N is an N-type (first conductivity type) semiconductor substrate comprised of Si.

The photodiode array PDA1 includes a plurality of avalanche photodiodes APD formed in the semiconductor substrate 1N. One avalanche photodiode APD constitutes one pixel in the photodiode array PDA1. While each avalanche photodiode APD is connected in series to a corresponding quenching resistor R1, all the avalanche photodiodes are connected in parallel and a reverse bias voltage is applied thereto from a power supply. Output currents from the avalanche photodiodes APD are detected by below-described signal processing units SP.

Each individual avalanche photodiode APD has a P-type (second conductivity type) first semiconductor region 1PA and a P-type (second conductivity type) second semiconductor region 1PB. The first semiconductor region 1PA is formed on the principal surface 1Na side of the semiconductor substrate 1N. The second semiconductor region 1PB is formed in the first semiconductor region 1PA and has a higher impurity concentration than the first semiconductor region 1PA. The planar shape of the second semiconductor region 1PB is, for example, a polygonal shape (octagon in the present embodiment). The depth of the first semiconductor region 1PA is larger than that of the second semiconductor region 1PB.

The semiconductor substrate 1N has N-type (first conductivity type) semiconductor regions 1PC. The semiconductor regions 1PC are formed on the principal face 1Na side of the semiconductor substrate 1N. The semiconductor regions 1PC prevent PN junctions formed between the N-type semiconductor substrate 1N and the P-type first semiconductor regions 1PA from being exposed to through holes TH in which below-described through-hole electrodes TE are arranged. The semiconductor regions 1PC are formed at positions corresponding to the through holes TH (through-hole electrodes TE).

Each avalanche photodiode APD, as also shown in FIG. 3, has an electrode E1 arranged on the principal face 1Na side of the semiconductor substrate 1N. The electrode E1 is connected to the second semiconductor region 1PB. The electrode E1 is arranged through an insulating layer L1 on the semiconductor substrate 1N outside the second semiconductor region 1PB, when viewed from the principal face 1Na side. FIG. 3 is drawn without illustration of the insulating layer L1 shown in FIG. 2, for clarity of structure. The first semiconductor region 1PA is electrically connected through the second semiconductor region 1PB to the electrode E1.

The avalanche photodiode APD, as also shown in FIG. 4, has an electrode (not shown) electrically connected to the semiconductor substrate 1N, an electrode E5, and an electrode E7 connected to the electrode E5, each of which is arranged on the principal face 1Nb side of the semiconductor substrate 1N. The electrode E5 is arranged through an insulating layer L2 on the semiconductor substrate 1N outside the second semiconductor region 1PB, when viewed from the principal surface 1Nb side. The electrode E7 is arranged through the insulating layer L2 on the semiconductor substrate 1N overlapping with the second semiconductor region 1PB, when viewed from the principal surface 1Nb side. Namely, the electrode E7 is arranged on a region corresponding to the second semiconductor region 1PB on the principal surface 1Nb. FIG. 4 is drawn without illustration of a passivation film PF shown in FIG. 2, for clarity of structure.

The photodiode array PDA1 includes a plurality of through-hole electrodes TE. The through-hole electrodes TB are provided for the respective individual avalanche photodiodes APD. The through-hole electrodes TB are formed so as to penetrate the semiconductor substrate 1N from the principal surface 1Na side to the principal surface 1Nb side. Namely, the through-hole electrodes TE are arranged in the through holes TH penetrating the semiconductor substrate 1N. The insulating layer L2 is also formed in the through holes TH. Therefore, the through-hole electrodes TB are arranged through the insulating layer L2 in the through holes TH.

The through-hole electrode TE has one end connected to the electrode E1 and the other end connected to the electrode E5. The second semiconductor region 1PB is electrically connected through the electrode E1, the through-hole electrode TE, and the electrode E5 to the electrode E7.

The through-hole electrode TE is arranged in a region among avalanche photodiodes APD on the plan view. In the present embodiment, the avalanche photodiodes APD are two-dimensionally arrayed in a matrix of M rows in a first direction and N columns in a second direction perpendicular to the first direction (M and N are natural numbers). The through-hole electrode TE is formed in the region surrounded by four avalanche photodiodes APD. Since the through-hole electrodes TE are provided for the respective avalanche photodiodes APD, they are two-dimensionally arrayed in the matrix of M rows in the first direction and N columns in the second direction.

The electrodes E1, E5, E7 and the through-hole electrodes TE are comprised of metal such as aluminum. When the semiconductor substrate is made of Si, a frequently used electrode material is, for example, AuGe/Ni, as well as aluminum. Although it depends on process design, the electrodes E5, electrodes E7, and through-hole electrodes TE can be integrally formed. An applicable method for forming the electrodes E1, E5, E7 and the through-hole electrodes TE is a sputtering process.

A P-type impurity to be used in the case using Si is a group 3 element such as B and an N-type impurity to be used is a group 5 element such as N, P, or As. If the semiconductor light detection element is constructed by interchanging the N type and P type of semiconductor conductivity types with each other, the element can also function well. An applicable method for adding these impurities is a diffusion process or an ion implantation process.

A material available for the insulating layers L1, L2 is $SiO_2$ or SiN. An applicable method for forming the insulating layers L1, L2 in the case of the insulating layers L1, L2 being made of $SiO_2$ is a thermal oxidation process or a sputtering process.

The mounting substrate 20 has a principal surface 20a and a principal surface 20h opposed to each other. The mounting substrate 20 has a rectangular shape on the plan view. The principal surface 20a is opposed to the principal surface 1Nb of the semiconductor substrate 1N. The mounting substrate 20 includes a plurality of electrodes E9 arranged on the principal surface 20a side. The electrodes E9 are arranged corresponding to the through-hole electrodes TE, as shown in FIGS. 2 and 5, Specifically, the electrodes E9 are arranged on respective regions opposed to the electrodes E7, on the principal surface 20a.

The side surfaces 1Nc of the semiconductor substrate 1N and the side surfaces 20c of the mounting substrate 20 are flush with each other, as shown in FIGS. 1 and 2. Namely, on the plan view, the outer edge of the semiconductor substrate 1N and the outer edge of the mounting substrate 20 are coincident.

The electrodes E7 and the electrodes E9 are connected through bump electrodes BE. This configuration makes the through-hole electrodes TE electrically connected through the electrodes E5, the electrodes E7, and the bump electrodes BE to the electrodes E9. Then, the second semiconductor regions 1PB are electrically connected to the electrodes E9 through the electrodes E1, through-hole electrodes TE, electrodes E5, electrodes E7, and bump electrodes BE. The electrodes E9 are also comprised of metal such as aluminum as the electrodes E1, E5, E7 and the through-hole electrodes TE are. The electrode material to be used may be, for example, AuGe/Ni, as well as aluminum. The bump electrodes BE are comprised, for example, of solder.

The bump electrodes BE are formed through unshown UBM (Under Bump Metal) on the electrodes E7. The UBM is comprised of a material that demonstrates superior electrical and physical connection with the bump electrodes BE. An applicable method for forming the UBM is an electroless plating process. An applicable method for forming the bump electrodes BE is a technique of mounting solder balls or a printing process.

The mounting substrate 20 includes a plurality of quenching resistors R1 and a plurality of signal processing units SP, as shown in FIG. 5. The mounting substrate 20 constitutes ASIC (Application Specific Integrated Circuit). FIG. 5 is drawn without illustration of the passivation film PF shown in FIG. 2, for clarity of structure.

The quenching resistors R1 are arranged on the principal surface 20a side. The quenching resistor R1 has one end electrically connected to the electrode E9 and the other end connected to a common electrode CE. The quenching resistor R1 constitutes a passive quenching circuit. The quenching resistors R1 are connected in parallel to the common electrode CE.

The signal processing units SP are arranged on the principal surface 20a side. The signal processing unit SP has an input end electrically connected to the electrode E9 and an output end connected to a signal line TL. An input into the signal processing unit SP is an output signal from the corresponding avalanche photodiode APD (semiconductor light detection element 10A) through the electrode E1, through-hole electrode TE, electrode E5, electrode E7, bump electrode BE, and electrode E9. The signal processing unit SP processes the output signal from each avalanche photodiode APD. The signal processing unit SP includes a CMOS circuit to convert the output signal from each avalanche photodiode APD into a digital pulse.

Passivation films PF with openings formed at the positions corresponding to the bump electrodes BE are arranged on the principal surface 1Nb side of the semiconductor substrate 1N and on the principal surface 20a side of the mounting substrate 20. The passivation films PF are comprised, for example, of SiN. An applicable method for forming the passivation films PF is a CVD (Chemical Vapor Deposition) process.

The glass substrate 30 has a principal surface 30a and a principal surface 30b opposed to each other. The glass substrate 30 has a rectangular shape on the plan view. The principal surface 30a is opposed to the principal surface 1Na of the semiconductor substrate 1N. The principal surface 30b is flat. In the present embodiment, the principal surface 30a is also flat. The glass substrate 30 and the semiconductor light detection element 10A are optically connected to each other with an optical adhesive OA. The glass substrate 30 may be directly formed on the semiconductor light detection element 10A.

The side surfaces 1Nc of the semiconductor substrate 1N and the side surfaces 30c of the glass substrate 30 are flush with each other, as also shown in FIG. 1. Namely, on the plan view, the outer edge of the semiconductor substrate 1N and the outer edge of the glass substrate 30 are coincident.

In the light detection device 1 (semiconductor light detection element 10A), the PN junctions are formed between the N-type semiconductor substrate 1N and the P-type first semiconductor regions 1PA, thereby forming the avalanche photodiodes APD. The semiconductor substrate 1N is electrically connected to the electrode (not shown) formed on the back surface of the substrate 1N and the first semiconductor regions 1PA are connected through the second semiconductor regions 1PB to the electrodes E1. The quenching resistor R1 is connected in series to the avalanche photodiode APD (cf. FIG. 6).

In the photodiode array PDA1, the individual avalanche photodiodes APD are made to operate in Geiger mode. In Geiger mode, a backward voltage (reverse bias voltage) larger than the breakdown voltage of the avalanche photodiodes APD is applied between anodes and cathodes of the avalanche photodiodes APD, Namely, a (−) potential V1 is applied to the anodes and a (+) potential V2 to the cathodes. The polarities of these potentials are relative ones, one of which can be the ground potential.

The anodes are the P-type first semiconductor regions 1PA while the cathodes are the N-type semiconductor substrate 1N. When light (photon) is incident into the avalanche photodiode APD, photoelectric conversion is effected inside the substrate to generate photoelectrons. Avalanche multiplication is effected in a region around the PN junction interface of the first semiconductor region 1PA and a group of multiplied electrons flow toward the electrode formed on the back surface of the semiconductor substrate 1N, Namely, with incidence of light (photon) into one pixel (avalanche photodiode APD) in the semiconductor light detection element 10A (photodiode array PDA1), it is subjected to multiplication to be taken out as signal from the electrode E9 and fed into the corresponding signal processing unit SP.

In the present embodiment, as described above, the quenching resistors R1 are arranged not on the semiconductor substrate 1N of the semiconductor light detection element 10A, but on the mounting substrate 20. Because of this configuration, each avalanche photodiode APD is formed in the semiconductor substrate 1N, without consideration to the space for arrangement of the quenching resistors R1 As a consequence of this, remarkable improvement is achieved in the fill factor of the light detection device 1 (semiconductor light detection element 10A).

Each avalanche photodiode APD has the semiconductor substrate 1N, the first semiconductor region 1PA, the second semiconductor region 1PB, and the electrode E1 electrically connected to the second semiconductor region 1PB, and in the semiconductor substrate 1N, the through-hole electrode TE penetrating from the principal surface 1Na side to the principal surface 1Nb and electrically connecting the corresponding electrode E1 and electrode E5 is formed for each avalanche photodiode APD. This configuration achieves remarkable improvement in the fill factor even in the case of the front-illuminated semiconductor light detection element 10A being used. In addition, since the electrode E1 and electrode E5 are electrically connected through the through-hole electrode TB, the interconnection distance from the second semiconductor region 1PB to the quenching resistor R1 through the electrode E1, through-hole electrode TB, electrodes E5, E7, bump electrode BE, and electrode E9 is relatively short. Therefore, the light detection device 1 is improved in temporal resolution, while suppressing the influence of resistances and capacitances of interconnections from the second semiconductor regions 1PB to the quenching resistors R1.

The mounting substrate 20 includes the common electrode CE to which the quenching resistors R1 are connected in parallel. This configuration allows the avalanche photodiodes APD (quenching resistors R1) to be connected in parallel, without increase in interconnection distances.

In the present embodiment, the glass substrate 30 arranged as opposed to the semiconductor light detection element 10A enhances the mechanical strength of the semiconductor substrate 1N. This is extremely effective, particularly, in the case where the semiconductor substrate 1N is thinned.

Figure 7:
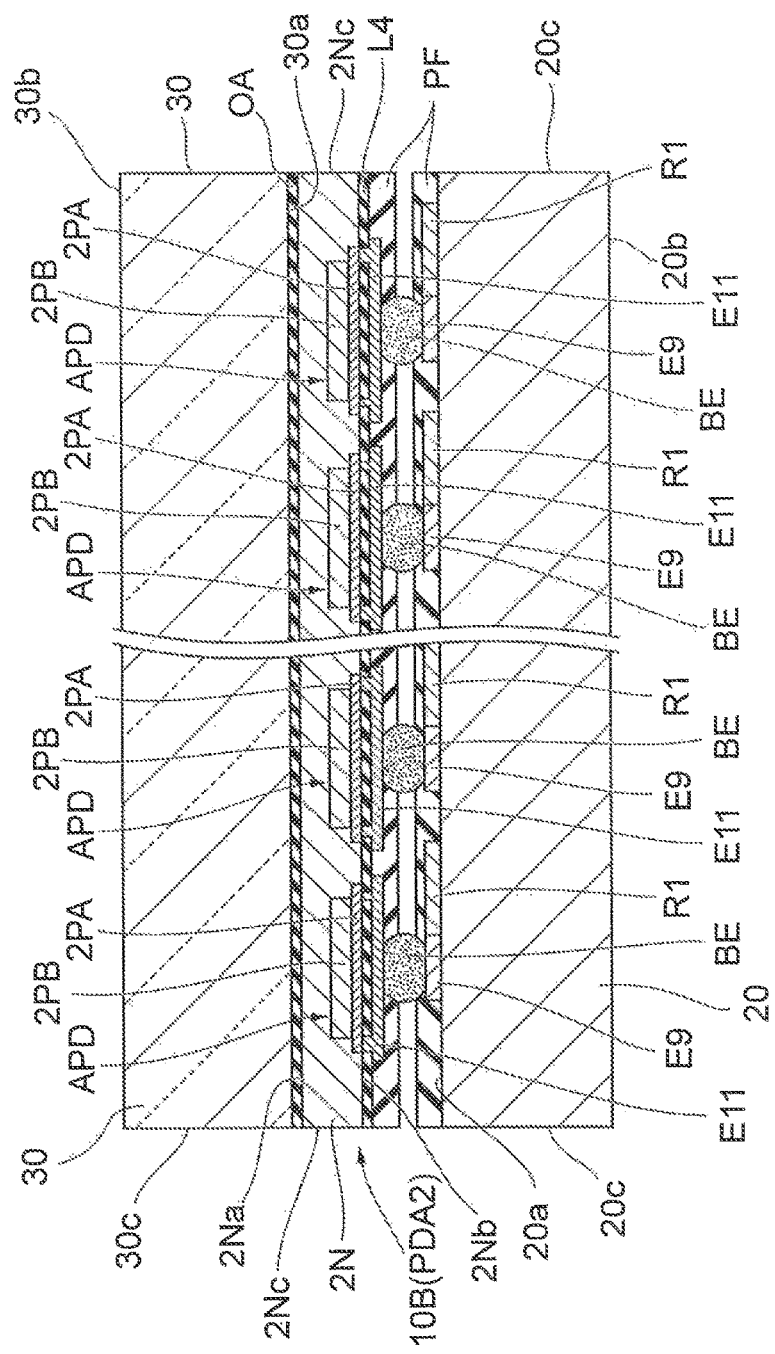
FIG. 7 is a drawing for explaining a sectional configuration of a light detection device according to a modification example of the present embodiment.
Figure 8:
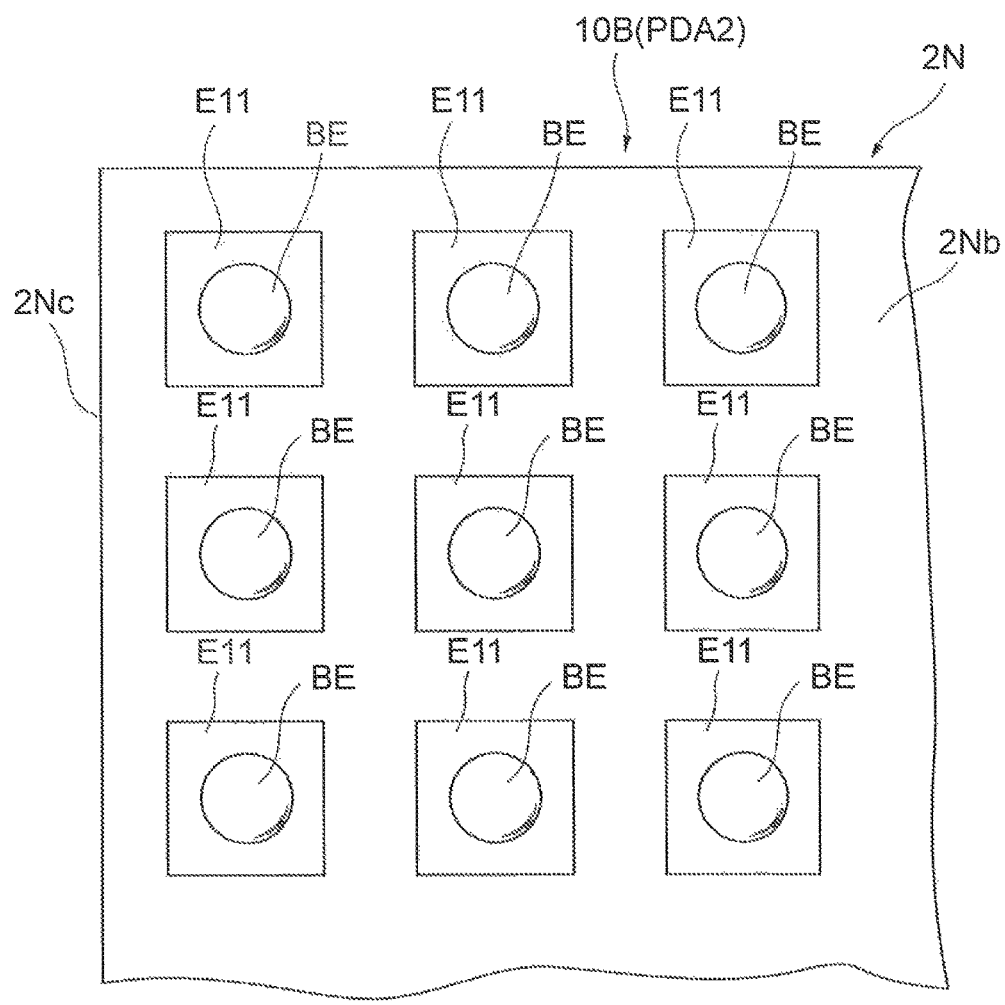
FIG. 8 is a schematic plan view of a semiconductor light detection element.

Next, a configuration of the light detection device 1 according to a modification example of the present embodiment will be described with reference to FIGS. 7 and 8. FIG. 7 is a drawing for explaining a sectional configuration of the light detection device according to the modification example of the present embodiment. FIG. 8 is a schematic plan view of the semiconductor light detection element.

The light detection device 1, as shown in FIGS. 7 and 8, has the semiconductor light detection element 10B, the mounting substrate 20, and the glass substrate 30. The mounting substrate 20 is arranged as opposed to the semiconductor light detection element 10B. The glass substrate 30 is arranged as opposed to the semiconductor light detection element 10B. The semiconductor light detection element 10B is arranged between the mounting substrate 20 and the glass substrate 30.

The semiconductor light detection element 10B consists of a back-illuminated photodiode array PDA2. The photodiode array PDA2 has a semiconductor substrate 2N of a rectangular shape on the plan view. The semiconductor substrate 2N includes a principal surface 2Na and a principal surface 2Nb opposed to each other. The semiconductor substrate 2N is a P-type (first conductivity type) semiconductor substrate comprised of Si. The semiconductor substrate 2N is electrically connected to an electrode (not shown) formed on the principal surface 2Nb side of the substrate 2N.

The photodiode array PDA2 includes a plurality of avalanche photodiodes APD formed in the semiconductor substrate 2N. One avalanche photodiode APD constitutes one pixel in the photodiode array PDA2.

Each individual avalanche photodiode APD has an N-type (first conductivity type) first semiconductor region 2PA, and a P-type (second conductivity type) second semiconductor region 2PB. The first semiconductor region 2PA is formed on the principal surface 2Nb side of the semiconductor substrate 2N. The second semiconductor region 2PB forms a PN junction with the first semiconductor region 2PA and has a higher impurity concentration than the semiconductor substrate 2N. The planar shape of the first semiconductor region 2PA is, for example, a polygonal shape (octagon in the present embodiment). The first semiconductor region 2PA functions as a cathode layer and the second semiconductor region 2PB as a multiplication layer.

An accumulation layer and an insulating layer (neither of which are shown) are arranged on the principal surface 2Na side of the semiconductor substrate 2N. The accumulation layer is formed by ion-implanting or diffusing a P-type impurity from the principal surface 2Na side in the semiconductor substrate 2N so that it has a higher impurity concentration than the semiconductor substrate 2N. The insulating layer is formed on the accumulation layer. A material available for the insulating layer is $SiO_2$ or SiN. An applicable method for forming the insulating layer in the case where the insulating layer is comprised of $SiO_2$ is a thermal oxidation process or a sputtering process.

The avalanche photodiode APD, as also shown in FIG. 8, has an electrode E11 arranged on the principal surface 2Nh side of the semiconductor substrate 2N. The electrode E11 is connected to the first semiconductor region 2PA. The electrode E11 is arranged through an insulating layer L4 on the semiconductor substrate 2N corresponding to the first semiconductor region 2PA, when viewed from the principal surface 2Nb side, FIG. 8 is drawn without illustration of the insulating layer L4 and passivation film PF shown in FIG. 7, for clarity of structure.

The electrode E11 and the electrode E9 are connected through a bump electrode BE. This configuration causes the first semiconductor region 2PA to be electrically connected to the electrode E9 through the electrode E11 and bump electrode BE. The electrode E11 is also comprised of metal such as aluminum as the electrode E9 is. The electrode material may be, for example, AuGe/Ni, as well as aluminum.

In the present modification example as well, as described above, the quenching resistors R1 are arranged not on the semiconductor substrate 2N of the semiconductor light detection element 10B but on the mounting substrate 20. Because of this configuration, each avalanche photodiode APD is formed in the semiconductor substrate 2N, without consideration to the space for arrangement of the quenching resistor R1. As a consequence of this, remarkable improvement is achieved in the fill factor of the light detection device 1 (semiconductor light detection element 10B).

Each avalanche photodiode APD has the semiconductor substrate 2N, the first semiconductor region 2PA, and the second semiconductor region 2PB, and the first semiconductor region 2PA and the electrode E9 are electrically connected. This configuration achieves remarkable improvement in the fill factor even in the case of the back-illuminated semiconductor light detection element 10B being used. In addition, since the electrode E11 and the electrode E9 are electrically connected through the bump electrode BE, the interconnection distance from the first semiconductor region 2PA to the quenching resistor R1 is extremely short. Therefore, the temporal resolution is further improved, while significantly suppressing the influence of resistances and capacitances of the interconnections from the first semiconductor regions 2PA to the quenching resistors R1.

In the present modification example as well, the glass substrate 30 arranged as opposed to the semiconductor light detection element 10B enhances the mechanical strength of the semiconductor substrate 2N. This is extremely effective, particularly, in the case where the semiconductor substrate 2N is thinned.

Figure 9:
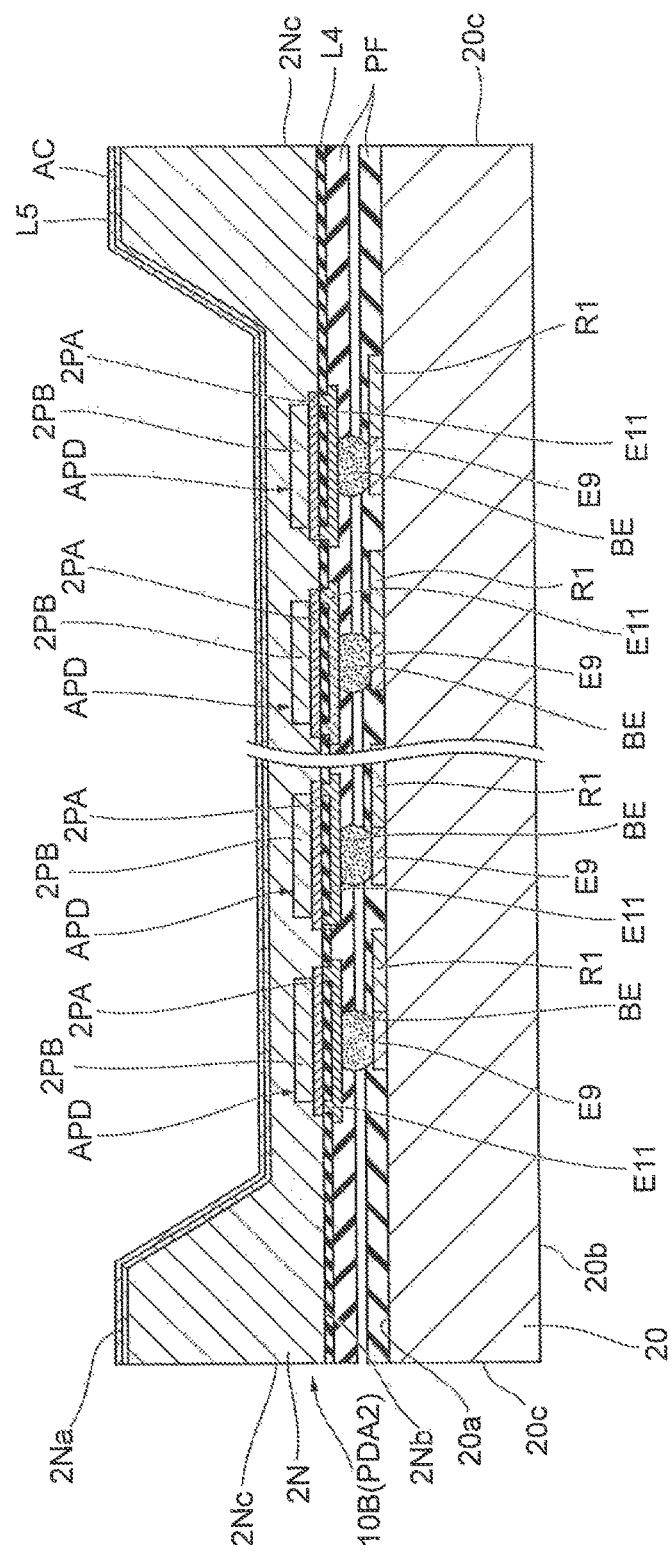
FIG. 9 is a drawing for explaining a sectional configuration of a light detection device according to a modification example of the present embodiment.

In the semiconductor substrate 2N, as shown in FIG. 9, a region where the plurality of avalanche photodiodes APD are formed is thinned from the principal surface 2Na side so as to remove a portion corresponding to the region where the plurality of avalanche photodiodes APD are formed in the semiconductor substrate 2N. The semiconductor substrate 2n exists as a frame part around the thinned region. The removing process of the semiconductor substrate 2N can be implemented by etching (e.g., dry etching or the like) or by polishing.

The accumulation layer AC and the insulating layer L5 are arranged on the principal surface 2Na side of the semiconductor substrate 2N. The accumulation layer AC is formed by ion-implanting or diffusing a P-type impurity from the principal surface 2Na side in the semiconductor substrate 2N so that it has a higher impurity concentration than the semiconductor substrate 2N. The insulating layer L5 is formed on the accumulation layer AC. The material available for the insulating layer L5 is $SiO_2$ or SiN. An applicable method for forming the insulating layer L5 in the case where the insulating layer L5 is comprised of $SiO_2$ is a thermal oxidation process or a sputtering process.

The above described the preferred embodiments of the present invention, and it should be noted that the present invention is by no means limited to the aforementioned embodiments and can be modified in many ways without departing from the scope and spirit of the invention.

Figure 10:
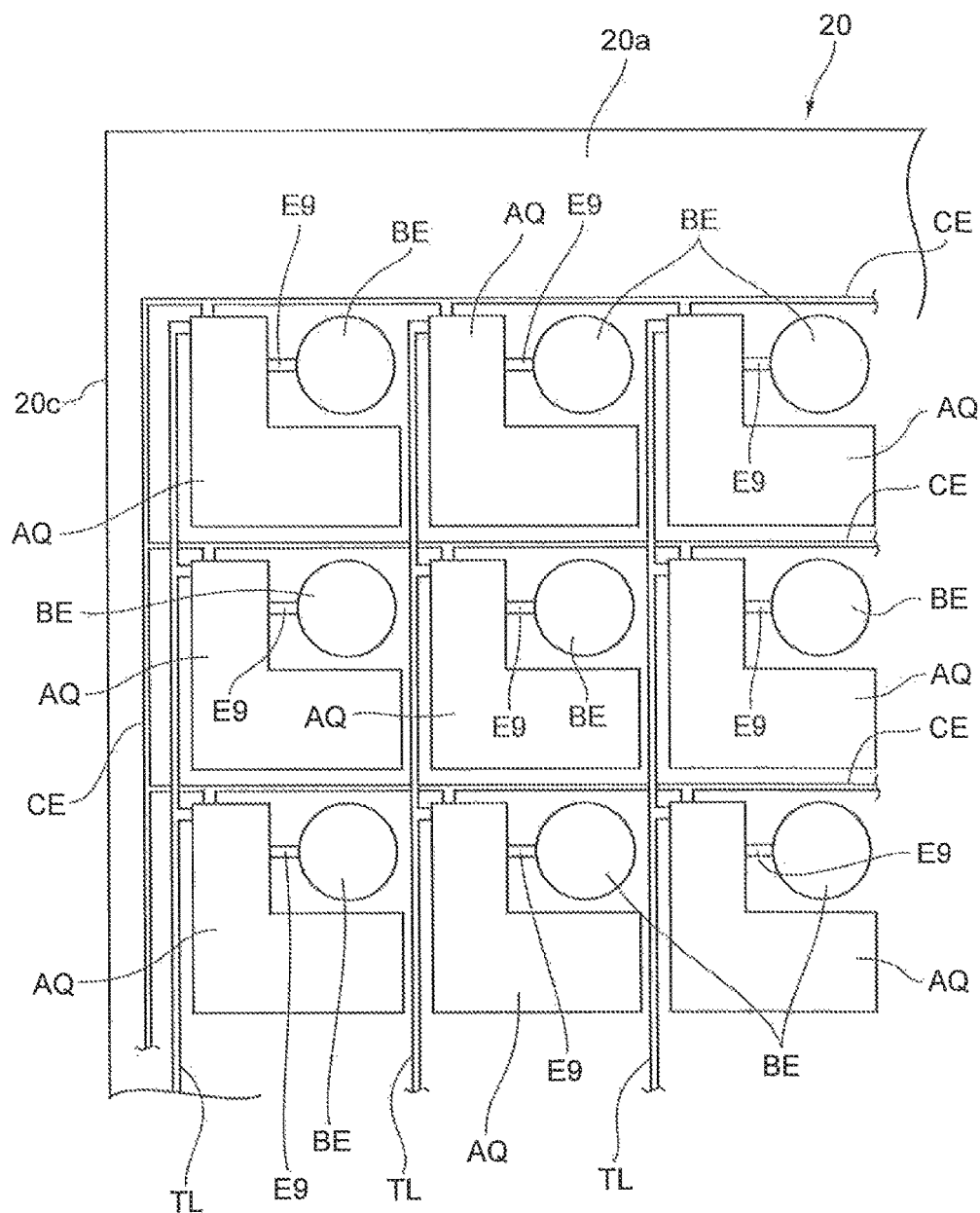
FIG. 10 is a schematic plan view of a mounting substrate.

The mounting substrate 20 may include active quenching circuits AQ, as shown in FIG. 10, instead of the passive quenching circuits (quenching resistors). The active quenching circuits AQ also function as signal processing units SP and include CMOS circuits. The common electrode CE and signal line TL are connected to each active quenching circuit AQ.

The active quenching circuit AQ converts an output signal from the corresponding avalanche photodiode APD into a digital pulse and performs ON/OFF operation of MOS by making use of the digital pulse obtained by the conversion, to implement forced drop and reset operation of voltage. When the mounting substrate 20 includes the active quenching circuits AQ, a voltage recovery time is reduced in the Geiger-mode operation of the semiconductor light detection element 10A, 10B.

The shapes of the first and second semiconductor regions 1PA, 1PB, 2PA, 2PB do not have to be limited to the aforementioned shapes hut may be other shapes (e.g., a circular shape or the like). The number (the number of rows and the number of columns) and arrangement of the avalanche photodiodes APD formed in the semiconductor substrate 1N, 2N do not have to be limited to those described above.

INDUSTRIAL APPLICABILITY

The present invention is applicable to the light detection devices for detecting weak light.

REFERENCE SIGNS LIST 1 light detection device; 1N, 2N semiconductor substrate; 1Na, 1Nb, 2Na, 2Nb principal surfaces; 1PA first semiconductor region; 1PB second semiconductor region; 2PA first semiconductor region; 2PB second semiconductor region; 10A, 10B semiconductor light detection element; 20 mounting substrate; 20*a*, 20*b* principal surfaces; APD avalanche photodiode; AQ active quenching circuit; BE bump electrode; CE common electrode; E1, E5, E7, E9, E11 electrodes; PDA1, PDA2 photodiode array; R1 quenching resistor; TE through-hole electrode.

The invention claimed is:

1. A light detection device comprising:
a semiconductor light detection element including a semiconductor substrate including first and second principal surfaces opposed to each other, a plurality of avalanche photodiodes operating in Geiger mode and formed in the semiconductor substrate, and first electrodes electrically connected to the respective avalanche photodiodes and arranged on the second principal surface side of the semiconductor substrate:
a mounting substrate including a third principal surface opposed to the second principal surface of the semiconductor substrate, and a plurality of second electrodes arranged corresponding to the respective first electrodes on the third principal surface side, the mounting substrate being arranged as opposed to the semiconductor light detection element; and
quenching circuits electrically connected to the respective second electrodes,
wherein the first electrodes and the second electrodes corresponding to the first electrodes are electrically connected through bump electrodes, and
wherein the quenching circuits are not arranged on the semiconductor substrate of the semiconductor light detection element.

2. The light detection device according to claim 1, wherein each of the avalanche photodiodes includes:
the semiconductor substrate of a first conductivity type;
a first semiconductor region of a second conductivity type formed on the first principal surface side of the semiconductor substrate;
a second semiconductor region of the second conductivity type formed in the first semiconductor region and having a higher impurity concentration than the first semiconductor region; and
a third electrode arranged on the first principal surface side of the semiconductor substrate and electrically connected to the second semiconductor region, and
wherein in the semiconductor substrate, a through-hole electrode penetrating from the first principal surface side to the second principal surface side and electrically connecting the corresponding third electrode and first electrode is formed for each avalanche photodiode.

3. The light detection device according to claim 1,
wherein each of the avalanche photodiodes includes:
the semiconductor substrate of a first conductivity type;
a first semiconductor region of a second conductivity type formed on the second principal surface side of the semiconductor substrate; and
a second semiconductor region of the first conductivity type forming a PN junction with the first semiconductor region and having a higher impurity concentration than the semiconductor substrate, and
wherein the first semiconductor region and the first electrode are electrically connected.

4. The light detection device according to claim 1,
wherein the mounting substrate further includes a common electrode to which the quenching circuits are connected in parallel.

5. The light detection device according to claim 1,
wherein the quenching circuits are passive quenching circuits or active quenching circuits.

* * * * *